US005574371A

United States Patent [19]

Tabanou et al.

[11] Patent Number: 5,574,371
[45] Date of Patent: Nov. 12, 1996

[54] METHOD AND APPARATUS FOR MEASURING MUD RESISTIVITY IN A WELLBORE INCLUDING A PROBE HAVING A BOTTOM ELECTRODE FOR PROPAGATING A CURRENT FROM AND TO THE BOTTOM ELECTRODE IN A DIRECTION APPROXIMATELY PARALLEL TO A LONGITUDINAL AXIS OF THE PROBE

[75] Inventors: Jacques R. Tabanou, Houston; Andre E. Orban, Sugarland, both of Tex.

[73] Assignee: Schlumberger Technology Corporation, Houston, Tex.

[21] Appl. No.: 594,419

[22] Filed: Jan. 31, 1996

Related U.S. Application Data

[63] Continuation of Ser. No. 330,397, Oct. 27, 1994.
[51] Int. Cl.$^6$ .............................. G01V 3/18; G01V 3/02
[52] U.S. Cl. ............................................. 324/324; 324/355
[58] Field of Search ................................... 324/323, 324, 324/347, 354, 357, 355, 366, 358; 73/155, 152

[56] References Cited

U.S. PATENT DOCUMENTS

| | | | |
|---|---|---|---|
| 2,342,827 | 2/1944 | Ackers | 324/324 |
| 2,838,730 | 6/1958 | Lebourg | 324/324 |
| 3,518,530 | 6/1970 | Wilson | 324/324 |
| 3,798,535 | 3/1974 | Schuster | 324/324 |
| 4,677,385 | 6/1987 | Chapman et al. | |
| 4,949,045 | 8/1990 | Clark et al. | |
| 5,235,285 | 8/1993 | Clark et al. | |
| 5,339,036 | 8/1994 | Clark et al. | |
| 5,339,037 | 8/1994 | Bonner et al. | |

*Primary Examiner*—Louis M. Arana
*Assistant Examiner*—Roger C. Phillips
*Attorney, Agent, or Firm*—John H. Bouchard

[57] ABSTRACT

A logging apparatus is adapted to be disposed in a mud filled wellbore, and a measurement probe is connected to a bottom of a tool string of the logging apparatus. The measurement probe is adapted for measuring a resistivity of a mud in the mud filled wellbore. The measurement probe includes a bottom electrode disposed on a bottom of the probe when the logging apparatus is disposed in the wellbore, a second electrode, and at least one measurement electrode disposed adjacent the bottom electrode for measuring a voltage potential drop in a region of the mud which is disposed directly below the bottom electrode of the measurement probe when the probe is disposed in the wellbore. When the measurement probe is energized, a current flows in the mud between the bottom electrode and the second electrode. When the current is initially emitted into the mud from the bottom electrode, and when the current is received from the mud in the bottom electrode, the current flows in a direction which is approximately parallel to a longitudinal axis of the logging apparatus tool string. Since the measurement electrode is disposed adjacent the bottom electrode, the measurement electrode measures the voltage potential drop in a region of the mud disposed directly below the bottom electrode. In addition, the voltage potential drop in such region measured by the measurement electrode is controlled primarily by the current being emitted from or received in the bottom electrode and flowing in such region.

23 Claims, 5 Drawing Sheets

METHOD AND APPARATUS FOR MEASURING MUD RESISTIVITY IN A WELLBORE INCLUDING A PROBE HAVING A BOTTOM ELECTRODE FOR PROPAGATING A CURRENT FROM AND TO THE BOTTOM ELECTRODE IN A DIRECTION APPROXIMATELY PARALLEL TO A LONGITUDINAL AXIS OF THE PROBE

This is a continuation of application Ser. No. 08/330,397 filed Oct. 27, 1994.

BACKGROUND OF THE INVENTION

The subject matter of the present invention relates to a method and apparatus adapted to be disposed in a wellbore for measuring a resistivity of a conductive mud in the wellbore, and more particularly, to such method and apparatus which includes a tool string adapted to be disposed in the mud filled wellbore and an electrode array connected to the tool string, the electrode array including a first electrode located at the absolute bottom of the tool string and a second electrode, one of the electrodes emitting a current for propagation through the conductive mud between the first electrode and the second electrode, the current propagating from the first electrode, along a longitudinal axis of the tool string, to the second electrode and from the second electrode, along the longitudinal axis of the tool string to the first electrode.

Induction logging tools have been disclosed in the prior art. For example, U.S. Pat. No. 5,157,605 to Chandler et al discloses one such induction logging apparatus, the disclosure of which is incorporated by reference into this specification. In addition, U.S. Pat. No. 5,041,975 to Minerbo et al discloses a wellbore correction system for use in the induction logging apparatus of the Chandler et al patent, the disclosure in the Minerbo et al patent being incorporated by reference into this specification. The correction system in the Minerbo et al patent corrects an error inherent in a set of output signals which are produced from the well logging apparatus when the apparatus is disposed in a wellbore. The error represents the effect of the wellbore on the output signals from the well logging apparatus. In order to correct the effect of a mud-filled wellbore on the output signals from the well logging apparatus, it is often required to know the value of a resistivity of the mud in the wellbore, and the mud resistivity value must be known with good accuracy. The wellbore penetrates a formation, and the formation has its own resistivity value. Very often, there is a large difference between the resistivity of the mud in the wellbore and the formation resistivity. As the formation to mud resistivity contrast increases for a particular depth in the wellbore, certain undesired perturbations can be seen in the output signals produced from the well logging apparatus in the wellbore. As a result, correcting these perturbations, which exist in the output signals from the induction well logging apparatus, becomes mandatory, especially when the well logging apparatus is logging large wellbores.

This problem, relating to the undesired perturbations in the output signals, has been known in the prior art. To solve this problem, a special mud resistivity sub, known as an Auxiliary Measurement Sub (AMS sub), was developed. The AMS sub was located at the top of the induction well logging apparatus tool string. It provided measurements of the resistivity of the mud in the wellbore in addition to further measurements including temperature measurements and tool acceleration measurements. However, the AMS sub is plagued by two problems: measurement accuracy and cost.

With respect to the measurement accuracy problem, measuring the resistivity of the mud in a mud filled wellbore, without allowing the measurement to be affected by the resistivity of the formation penetrated by the wellbore or the position of the measuring tool within the wellbore, can be a very challenging problem, especially when the diameter of the wellbore ranges from 5 inches to 24 inches. One factor which may lead to an inaccurate measurement of the mud resistivity in a wellbore is the influence of the resistivity of the formation on the measurement. A resistivity probe, where 99% of its volumetric response comes from inside the wellbore, would make a 100% error during the estimation of mud resistivity in the wellbore when the formation penetrated by the wellbore is 100 times more resistive than the mud. As a result, the measurement probe must have an extremely shallow depth of investigation in the wellbore in order for the measurement probe to be immune to the formation resistivity. In order to reduce the adverse effect which the formation resistivity has on the accuracy of a mud resistivity measurement taken by the AMS sub, an outer wall of the AMS sub included a recess, and a set of electrodes were located within the recess. The electrodes of the AMS sub include current emitting, current receiving, and measurement electrodes. However, even though the set of electrodes were located within the recess in the outer wall of the AMS sub, the accuracy of the mud resistivity measurement taken by the AMS sub was still adversely affected by the differences between the mud resistivity in the wellbore and the formation resistivity penetrated by the wellbore.

With respect to the cost problem, since the AMS sub was located at the top of a tool string in the wellbore, it must provide means for electronically connecting a cable head with a remaining part of the tool string. As a result, an expensive multi conductor head (each head being a 31-pin head costing $10,000 dollars each) must be located at the top and at the bottom of the AMS sub thereby increasing the overall cost of the AMS sub.

Therefore, another method and apparatus is needed for taking mud resistivitymeasurements in a wellbore, especially when there is a significant difference between the resistivity of the mud in a wellbore and the resistivity of a formation penetrated by the wellbore.

SUMMARY OF THE INVENTION

It is a primary object of the present invention to provide a measurement method and apparatus adapted to be located at a bottom of a tool string in a mud filled wellbore for taking a measurement of a resistivity of the mud in the wellbore without allowing the accuracy of the measurement to be adversely affected by a resistivity of a formation penetrated by the wellbore It is a further object of the present invention to provide a measurement method practiced by a measurement probe adapted to be disposed in a mud filled wellbore for measuring a resistivity of the mud in the wellbore without allowing a resistivity of a formation penetrated by the wellbore to adversely affect the accuracy of the measurement including the steps of lowering an apparatus into the wellbore, the apparatus including a tool string and the measurement probe connected to a bottom of the tool string when the apparatus is disposed in the wellbore, the probe including a bottom electrode connected to a bottom of the probe and a second electrode; conducting a current in the mud between the bottom electrode and the second electrode when the apparatus is disposed in the wellbore, the current in the mud propagating in a direction which is approximately parallel to a longitudinal axis of the probe when the current is initially emitted from or is received in the bottom electrode; and measuring a voltage potential drop in a region of the mud disposed below the bottom electrode when the apparatus is disposed in the wellbore and the current is conducted between the bottom electrode and the second electrode, the voltage potential drop in such region being controlled by the current emitted from or received in the bottom electrode and flowing in such region.

It is a further object of the present invention to provide a measurement method practiced by a measurement probe adapted to be disposed in a mud filled wellbore for measuring a resistivity of the mud in the wellbore without allowing a resistivity of a formation penetrated by the wellbore to adversely effect the accuracy of the measurement including the steps of transmitting a current from a current emitting electrode located at a bottom of a tool string in the wellbore initially in a downward direction into the mud in the wellbore where the initial downward direction of the emitted current is approximately parallel to a longitudinal axis of of the measurement probe; propagating the current in the mud to a current receiving electrode; and measuring a drop of potential which exists adjacent the current emitting electrode in the mud.

It is a further object of the present invention to provide a measurement probe adapted to be disposed in a wellbore including a probe body, a bottom electrode connected to a bottom of the probe body, a second electrode connected to the probe body, and at least one measurement electrode disposed adjacent the bottom electrode and adapted to measure a voltage potential drop which exists in a region disposed directly adjacent and below the bottom electrode, a current adapted to flow between the bottom electrode and the second electrode when the probe is disposed in the wellbore, the current flowing in a direction which is approximately parallel to a longitudinal axis of the probe when the probe is disposed in the wellbore and the current is initially emitted from or is received in the bottom electrode, the voltage potential drop in the region that is measured by the measurement electrode being controlled by the current emitted from or received in the bottom electrode and flowing in the region.

It is a further object of the present invention to provide a logging apparatus adapted to be disposed in a mud filled wellbore including a measurement apparatus adapted to be located at a bottom of the logging apparatus tool string for taking a measurement of a resistivity of the mud in the wellbore without allowing the accuracy of the measurement to be adversely affected by a resistivity of a formation penetrated by the wellbore.

It is a further object of the present invention to provide a logging apparatus adapted to be disposed in a mud filled wellbore including a measurement apparatus adapted to be located at a bottom of the logging apparatus tool string for taking a measurement of the resistivity of the mud in the wellbore without being adversely effected by the resistivity of a formation penetrated by the wellbore, the measurement apparatus including a probe body, a bottom electrode connected to a bottom of the probe body, a second electrode connected to the probe body, and at least one measurement electrode disposed adjacent the bottom electrode and adapted to measure a voltage potential drop which exists in a region disposed directly adjacent and below the bottom electrode, a current adapted to flow between the bottom electrode and the second electrode when the probe is disposed in the wellbore, the current flowing in a direction which is approximately parallel to a longitudinal axis of the probe when the probe is disposed in the wellbore and the current is initially emitted from or is received in the bottom electrode, the voltage potential drop in the region that is measured by the measurement electrode being controlled by the current emitted from or received in the bottom electrode and flowing in the region.

It is a further object of the present invention to provide a logging apparatus adapted to be disposed in a mud filled wellbore including a measurement apparatus adapted to be located at a bottom of the logging apparatus tool string for taking a measurement of the resistivity of the mud in the wellbore without being adversely affected by the resistivity of a formation penetrated by the wellbore, the measurement apparatus including a bottom electrode located at a bottom of the measurement apparatus and at a bottom of the logging apparatus tool string, the bottom electrode emitting a current and initially flowing the current in a vertical direction into the mud in the wellbore, or receiving the current which is flowing in a vertical direction into the bottom electrode, when the logging apparatus is disposed in the wellbore.

It is a further object of the present invention to provide a logging apparatus adapted to be disposed in a mud filled wellbore including a measurement apparatus adapted to be located at a bottom of the logging apparatus tool string for taking a measurement of the resistivity of the mud in the wellbore without simultaneously being adversely effected by the resistivity of a formation penetrated by the wellbore, the measurement apparatus including a current emitting electrode, which is located at a bottom of the measurement apparatus and at a bottom of the logging apparatus tool string, and a current receiving electrode, the current emitting electrode initially emitting a current in a downward direction and into the mud in the wellbore, the downward direction being approximately parallel to a longitudinal axis of the tool string when the logging apparatus and associated measurement apparatus is disposed in the wellbore, the current being received by the receiving electrode without crossing an interface between the mud in the wellbore and a formation penetrated by the wellbore.

In accordance with these and other objects of the present invention, a logging apparatus is adapted to be disposed in a mud filled wellbore, and a measurement probe is connected to a bottom of a tool string of the logging apparatus. The measurement probe is adapted for measuring a resistivity of a mud in the mud filled wellbore. The measurement probe includes a bottom electrode disposed on a bottom of the probe when the logging apparatus is disposed in the wellbore, a second electrode, and at least one measurement electrode disposed adjacent the bottom electrode for measuring a voltage potential drop in a region of the mud which is disposed directly adjacent and below the bottom electrode of the measurement probe. When the measurement probe is energized, a current flows in the mud between the bottom electrode and the second electrode. When the current is initially emitted into the mud from the bottom electrode, and when the current is received from the mud in the bottom electrode, the current flows in a direction which is approximately parallel to a longitudinal axis of the logging apparatus tool string. Since the measurement electrode is disposed adjacent the bottom electrode, the measurement electrode measures the voltage potential drop in the region of the mud disposed directly below the bottom electrode. In addition, the voltage potential drop in such region measured by the measurement electrode is controlled by the current being emitted from or received in the bottom electrode and flowing in such region.

Since the current being initially emitted from and received in the bottom electrode of the measurement probe propagates in the mud in a direction which is approximately parallel to a longitudinal axis of the probe, only a very small quantity of such current crosses an interface between the mud in the wellbore and a formation penetrated by the wellbore. As a result, the voltage potential drop being measured by the measurement electrode is controlled primarily by the potential drop which exists in the region of the mud disposed adjacent and directly below the bottom electrode. Therefore, even though a large contrast in resistivity may exist at an interface between the conductive mud in the wellbore and the formation penetrated by the wellbore, since most of the current received in and emitted from the bottom electrode fails to cross such interface, that resistivity contrast fails to adversely affect the accuracy of the measurement of the mud resistivity taken by the measurement probe of the present invention.

Further scope of applicability of the present invention will become apparent from the detailed description presented hereinafter. It should be understood, however, that the detailed description and the specific examples, while representing a preferred embodiment of the present invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein.

DETAILED DESCRIPTION OF THE PREFERRED EMBODIMENT

Figure 1:
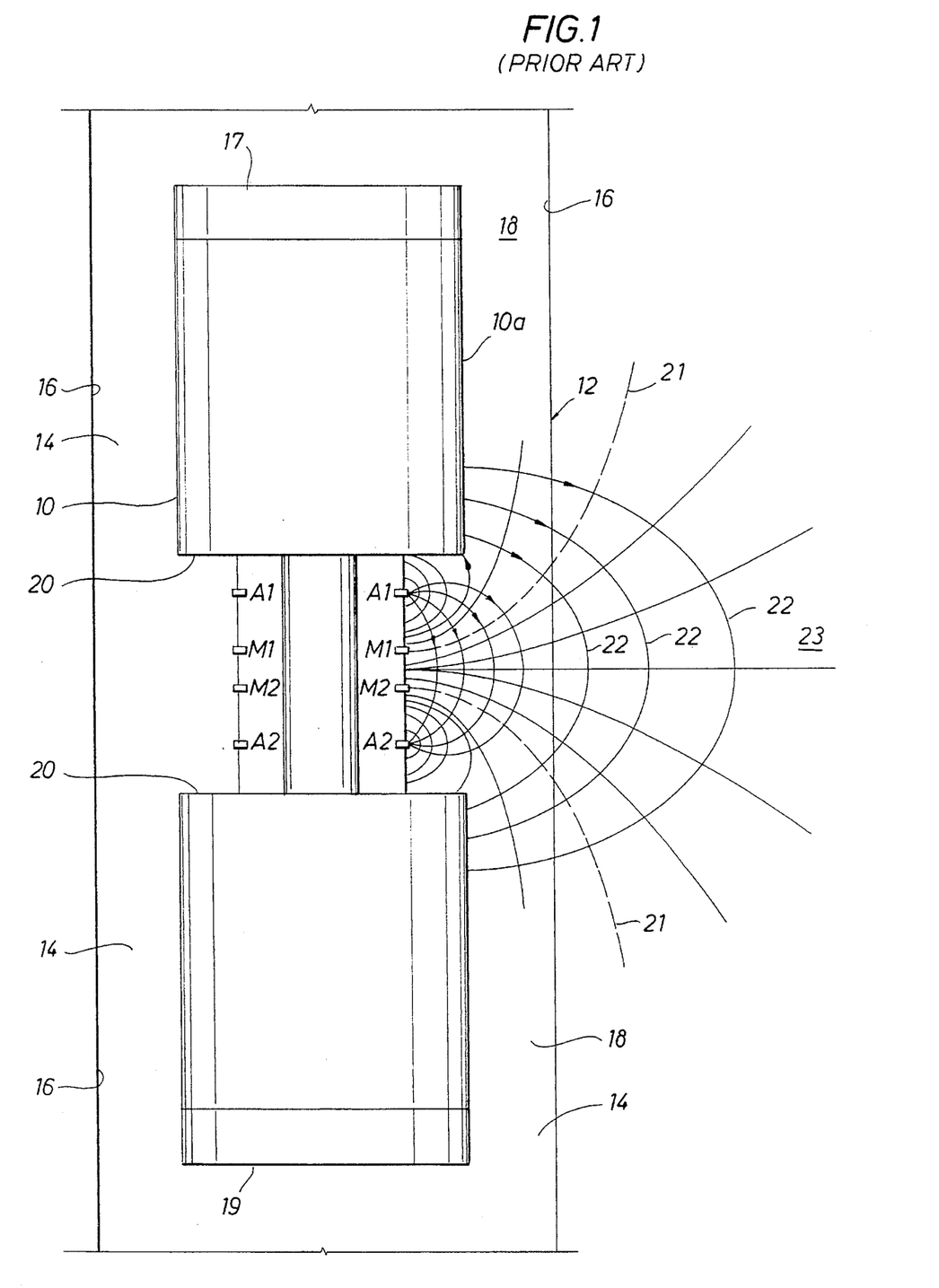
FIG. 1 illustrates a construction of the prior art AMS sub discussed in the background section of this specification.

Referring to FIG. 1, a construction of the prior art Auxiliary Measurement Sub (AMS sub), discussed in the background section of this specification, is illustrated.

In FIG. 1, the AMS sub was connected to a top of a well logging apparatus tool string, of the type disclosed in U.S. Pat. No. 5,157,605 to Chandler et al. The Chandler et al patent discloses an induction well logging apparatus. The AMS sub includes a sub body 10 disposed in a wellbore 12 and defining an annular space 14 between the sub body 10 and a wall 16 of a formation penetrated by the wellbore 12. A multiple pin connector head 17 (typically, a 31 pin head) is connected to a top of the body 10 and another multiple pin connector head 19 is connected to a bottom of the body 10. The connector heads 17 and 19 are adapted to conduct a current to and from the AMS sub of FIG. 1, and it is also used to transmit signals and power to the tools located below the AMS sub. The heads 17 and 19, which must withstand a high mud external pressure, are each very expensive to manufacture, costing about ten thousand dollars each. A conductive mud 18 is disposed within the annular space 14. The sub body 10 includes a recess 20 which is inwardly disposed relative to an outer wall of the sub body 10. A set of electrodes A1, M1, M2, and A2 are disposed within the recess 20. The electrode A1, called a current emitting electrode, is adapted to emit a current into the conductive mud 18, the current propagating through the mud 18 and being received by the electrode A2, called a current receiving electrode. The electrodes M1 and M2, called measurement electrodes, are disposed between the A1 electrode and the A2 electrode and measure a voltage potential drop which exists in a region 23 which is enclosed by a pair of equipotential lines 21, the region 23 including the conductive mud 18 in the wellbore 12 and the formation penetrated by the wellbore 12. The voltage potential drop in region 23 of FIG. 1 is supposed to be representative of a resistivity (Rm) of only the conductive mud 18 in the annular space 14. However, a problem exists: the voltage potential drop in region 23 of FIG. 1 is actually representative of the resistivity of both the mud 18 and the formation penetrated by the wellbore 12. In order to avoid this problem, in FIG. 1, the AMS sub was purposely manufactured with the recess 20 so that the electrodes A1, M1, M2, and A2 could be placed within that recess 20. The reason for the recess 20 is as follows. When the electrodes were placed on the outer wall 10a of the sub body 10, the current being emitted from the current emitting electrode A1 would cross an interface (wall 16) which exists between the conductive mud 18 and the formation penetrated by the wellbore 12 thereby adversely affecting the accuracy of the measurement of the resistivity (Rm) of the conductive mud 18. When the electrodes A1, M1, M2, and A2 are placed in the recess 20, a much smaller quantity of the current, being emitted from the emitting electrode A1, is able to cross the interface 16 between the mud 18 and the formation. Consequently, that part of the voltage potential drop in region 23 resultant from the current flowing in the formation penetrated by the wellbore 12 was reduced; and, as a result, the adverse effect on the measurement of the resistivity (Rm) of the mud 18 in the wellbore 12 was reduced. However, as shown in FIG. 1, some current 22, called "crossing current" 22, from the emitting electrode A1 still crosses the interface 16 and flows in the formation penetrated by the wellbore. As a result, the voltage potential drop in region 23 of FIG. 1 enclosed by the pair of equipotential lines 21 and measured by the measurement electrodes M1 and M2 still includes both the potential drop of the conductive mud 18 and the potential drop in the formation penetrated by the wellbore 12. Therefore, when using the AMS sub of FIG. 1, the adverse effect of the crossing current 22 on the mud resistivity (Rm) measurement still exists and, as a result, the mud resistivity measurement is not as accurate as desired. In addition, the AMS sub of FIG. 1 still requires two very expensive multi pin connector heads 17 and 19. As a result, an AMS sub can be very expensive, costing at least twenty thousand dollars, ten thousand dollars for each of the two connector heads.

However, the novel measurement probe in accordance with the present invention almost totally eliminates the aforementioned adverse effect which the crossing current 22 has on the mud resistivity (RM) measurement because, when the novel measurement probe is used, there exists almost no crossing current. As a result, the mud resistivity measurement, taken by the novel measurement probe of the present invention, is much more accurate than the mud resistivity measurement taken by the AMS sub of FIG. 1.

Figure 2:
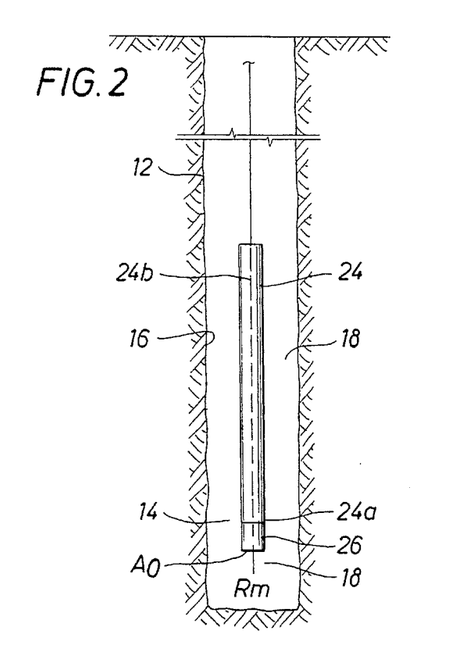
FIG. 2 illustrates a well logging apparatus disposed in a wellbore and a novel measurement probe in accordance with the present invention connected to a bottom of the well logging apparatus tool string.

Referring to FIG. 2, a well logging apparatus including the novel measurement probe of the present invention is illustrated.

In FIG. 2, a well logging apparatus 24 is disposed in wellbore 12. The well logging apparatus 24 could be the induction well logging apparatus disclosed in U.S. Pat. No. 5,157,605 to Chandler et al, the disclosure of which is incorporated by reference into this specification. A novel measurement probe 26, in accordance with the present invention, is connected to the bottom 24a of the well logging apparatus 24. The probe 26 is adapted to measure the resistivity "Rm" of the conductive mud 18 which is disposed directly below the probe 26 in the wellbore 12. The mud resistivity measurement taken by probe 26 in FIG. 2 is much more accurate than the mud resistivity measurement taken by the AMS sub in FIG. 1 because the probe 26 includes a bottom electrode $A_0$ connected to the absolute bottom of the probe 26. When a current is initially emitted from or is received in the bottom electrode $A_0$, such current propagates in the mud 18 in a direction which is approximately parallel to a longitudinal axis 24b of the well logging apparatus 24. As a result, most of a particular voltage potential drop, occurring in a region of the conductive mud 18 which is located directly below the bottom electrode, results from the potential drop of the mud 18 and not of the formation penetrated by the wellbore 12. Therefore, when a nearby measurement electrode measures such particular voltage potential drop, almost all of that particular potential drop will represent a drop of potential occurring solely in the mud 18 in the wellbore and not in the formation penetrated by the wellbore. As a result, when using the novel measurement probe 26 of the present invention, the accuracy of the mud resistivity measurement is vastly improved relative to the mud resistivity measurement of the prior art AMS sub.

In order to reduce the cost of a mud resistivity measurement probe, the probe 26 must be located at the bottom of the tool string as shown in FIG. 2. The probe 26 does not require any expensive through wiring since the probe 26 includes only four wires which are necessary to make the mud resistivity (Rm) measurement.

The induction logging apparatus of the above referenced Chandler et al patent includes a ring electrode (called "an SP electrode") connected to the absolute bottom of the induction logging apparatus tool string adapted for measuring a Spontaneous Potential (SP). A rubber cap, called a "bull nose", is usually fit at the bottom of the SP electrode for protecting the SP electrode during transportation and logging. It is therefore logical and economical to design the novel measurement probe 26 of FIG. 2 as part of such rubber "bull nose". For more information on the measurement of the Spontaneous Potential of an earth formation, refer to pending patent application Ser. No. 08/080,428, filed Jun. 18, 1993, entitled "A Spontaneous Potential Measurement Apparatus Connected Between Metallic Housings of a Wellbore Apparatus for Measuring the Spontaneous Potential of an Earth Formation", now U.S. Pat. No. 5,402,369 the disclosure of which is incorporated by reference into this specification.

Figure 3:
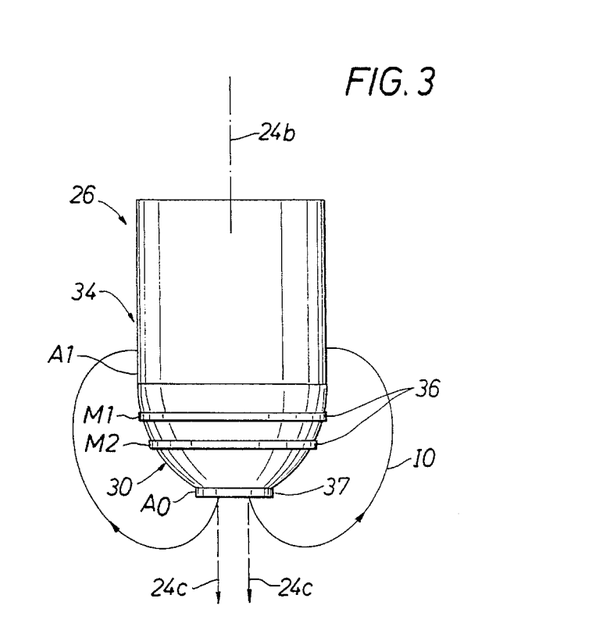
FIGS. 3 through 5 illustrate a detailed construction of a preferred embodiment of the novel measurement probe of FIG. 2.

Referring to FIG. 3, a first and preferred embodiment of the novel measurement probe 26 of FIG. 2 the present invention is illustrated.

In FIG. 3, the novel measurement probe 26 of the present invention includes an SP electrode (A1) 34 adapted for emitting a current $I_0$ into the mud 18 and for receiving the current $I_0$ from the mud, and a curved disk, otherwise known as a "bull nose" 30, integrally connected to a bottom of the SP electrode 34. Three additional electrodes are mounted on the curved disk 30: a small disk shaped bottom electrode ($A_0$) 32 located at the bottom tip of the curved disk 30 and adapted for emitting the current $I_0$ in a downward direction into the mud 18 and for receiving the current $I_0$ from the mud, and a pair of measurement electrodes (M1 and M2) 36 located between the bottom electrode ($A_0$) 32 and the SP electrode ($A_1$) 34.

The bottom electrode ($A_0$) 32 functions to emit a current $I_0$ into the mud 18, the current $I_0$ in the mud being received by the SP electrode 34. The bottom electrode 32 also functions to receive the current $I_0$ from the mud 18, the current in the mud originating from the SP electrode 34. When the current $I_0$ is initially emitted from the bottom electrode 32 into the mud 18 or is received from the mud 18 into the bottom electrode 32, the current propagates in a direction 24c which is approximately parallel to a longitudinal axis 24b of the probe 26.

Figure 9:
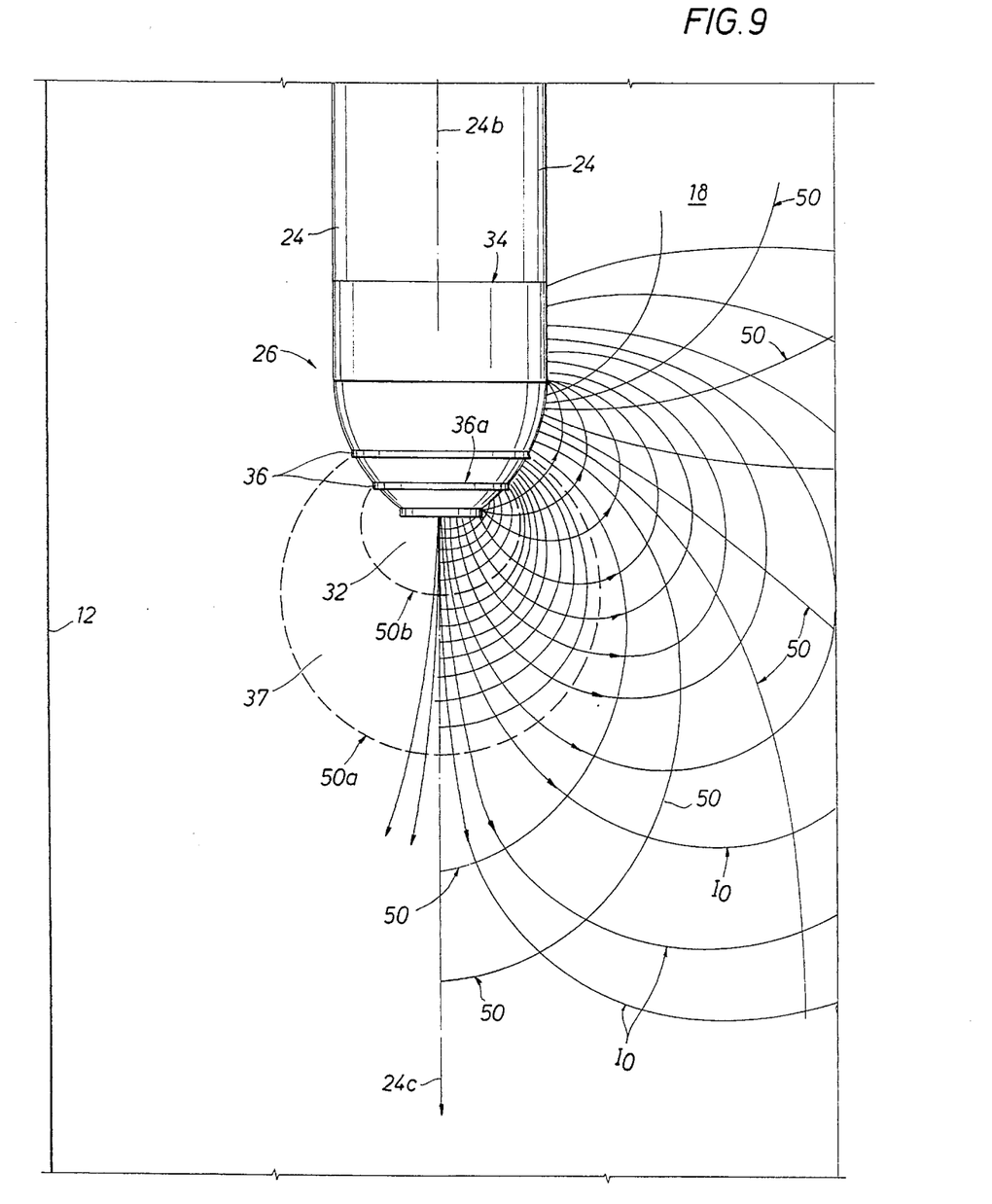
FIG. 9 illustrates a functional operation of the novel measurement probe of the present invention shown in FIGS. 3 through 5.

The measurement electrodes 36, and in particular measurement electrode M2, will measure a particular voltage potential drop which exists in a region 37 (where region 37 is best seen in FIG. 9) that is located directly adjacent and below the bottom electrode 32. Most of such particular voltage potential drop results from a potential drop existing in the mud 18 in the wellbore and not in the formation penetrated by the wellbore 12. As a result, such particular voltage potential drop, measured by the measurement electrodes 36, will produce a mud resistivity measurement which is more accurate than that produced by the AMS sub of FIGS. 1 and 2.

The resistivity of the conductive mud 18 is estimated by the following formula:

$$Rm = K(VM2 - VM1)/I_0, \text{ where}$$

Rm is the estimated resistivity of the conductive mud 18;

K is the probe calibration constant;

VM1 is the potential recorded on measurement electrode M1;

VM2 is the potential recorded on measurement electrode M2; and $I_0$ is the total current emitted by the $A_0$ electrode 32.

To be practically insensitive to the resistivity of the formation penetrated by wellbore 12, the bottom electrode $A_0$ 32 in FIG. 3 is connected to a bottom of the curved disk 30, and the current $I_0$ being initially emitted from the bottom electrode 32 or being received in the bottom electrode 32 propagates in a direction which is approximately parallel to a longitudinal axis 24b of the probe 26 of FIG. 3. When the current $I_0$ is initially emitted from the bottom electrode 32, the current propagates in a downward direction 24c into the conductive mud 18.

Since the current $I_0$, being emitted from or received in the bottom electrode 32, propagates in a direction 24c which is approximately parallel to a longitudinal axis 24b of the probe 26, only a very small portion of the current ($I_0$) functions as a crossing current, such as crossing current 22 of FIG. 1. Almost all of the current ($I_0$), being emitted from or received in the bottom electrode 32, fails to cross the interface 16 between the conductive mud 18 and the formation penetrated by wellbore 12. As discussed below and shown in FIG. 10, the "maximum error", between the true mud resistivity value and the one measured by the probe 26 of the present invention, is about 8 percent for a 4 inch hole and less than 1 percent for an 8 inch hole over the entire Rt/Rm range on the x-axis. The aforementioned "1 percent" error means that the volumetric contribution of the signal coming from the formation being investigated is 10000 times smaller than the one coming from the mud when the formation resistivity is 100 times greater than the mud resistivity. That is, consider the following:

The mud resistivity "Rm" can be expressed as:

$$Rm = (1-J_F)Rm\_true + J_F R_F, \text{ where}$$

Rm is the mud resistivity measured by the probe,

Rm_true is the true mud resistivity, and $J_F$ is the normalized volumetric contribution of the formation to the mud resistivity measurement ($0 < J_F < 1$).

The measurement error in percent is:

$$(Rm\_true-Rm)/Rm\_true = J_F - J_F R_F/Rm\_true = J_F(1-R_F/Rm\_true)$$

But, since $R_F/Rm\_true$ is usually $>>1$, therefore:

$$(Rm\_true-Rm)/Rm\_true = -J_F R_F/Rm\_true$$

The minus sign indicates that the effect of the formation resistivity is to make the measurement read higher than it should.

If the formation to mud resistivity contrast $R_F/Rm\_true = 100$ to limit the mud resistivity error $(Rm\_true-Rm)/Rm\_true$ to less than 1% or $10^{-2}$, the normalized volumetric contribution of the formation $J_F$ must be such that $J_F < 10^{-4}$ or 1 part in 10000.

Therefore, in FIG. 3, since most of the current $I_0$ cannot function as a crossing current, the contrast or difference between the resistivity of the formation and the resistivity of the conductive mud 18 cannot adversely effect the accuracy of the mud resistivity measurement taken by the novel measurement probe 26 of the present invention shown in FIG. 3 of the drawings.

Figures 4, 5:
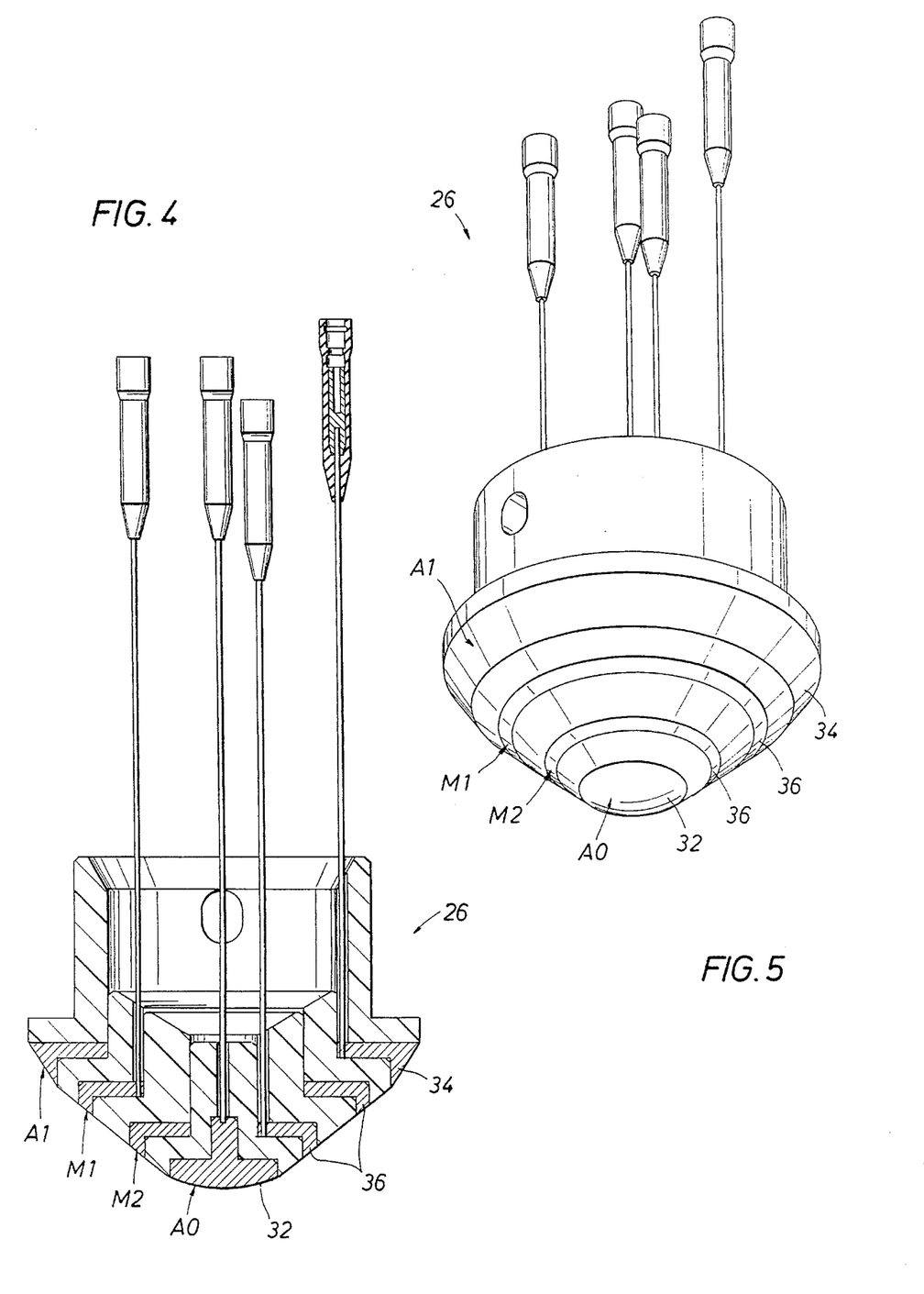

Referring to FIGS. 4 and 5, the novel measurement probe 26 shown in FIG. 3 is illustrated again in FIGS. 4 and 5.

In FIGS. 4 and 5, the mud resistivity measurement probe 26 of FIG. 3, which is attached to the well logging apparatus 24 of FIG. 2, is shown again and includes the A0 electrode 32, the measurement electrodes (M2 and M1) 36, and the A1 electrode 34 separated by insulating material.

Figure 6:
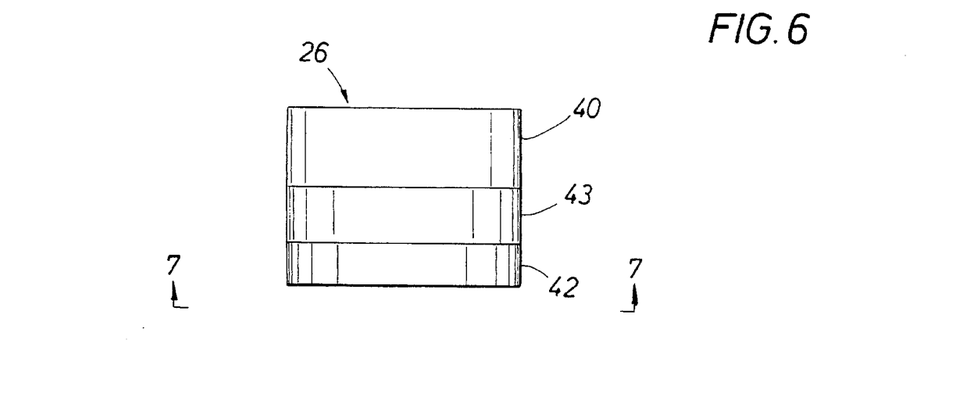
FIGS. 6 through 8 illustrate a detailed construction of a second embodiment of the novel measurement probe of FIG. 2 which is more suited to mathematical modelling.
Figure 7:
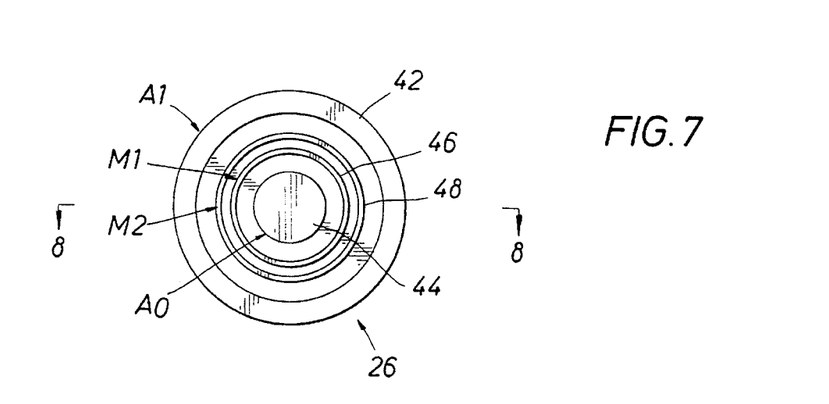
Figure 8:
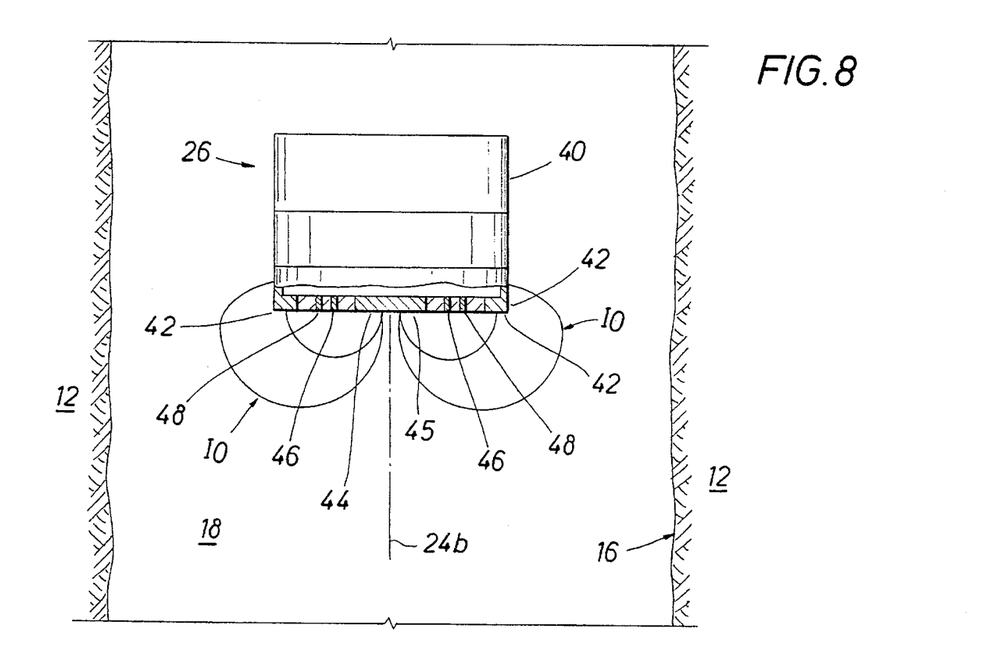

Referring to FIGS. 6–8, a second embodiment of the novel measurement probe 26 of FIG. 2 is illustrated, this embodiment being used primarily for mathematical modelling or simulation purposes.

In FIG. 6, a side view of the novel measurement probe 26 of the present invention is illustrated. In FIG. 6, the novel measurement probe 26 comprises a Spontaneous Potential (SP) electrode 40 short circuited to an A1 electrode 42.

In FIG. 7, a bottom view of the novel measurement probe 26 of FIG. 6, taken along section lines 7—7 of FIG. 6, is illustrated. In FIG. 7, the curved disk 30 of FIG. 3 has be replaced by a flat disk on which four concentric rings are located. In FIG. 7, the four concentric rings in the flat disk include the following electrodes: (1) the A1 electrode 42 which is integrally connected via a short circuit 43 to the SP electrode 40 in FIG. 6, (2) the bottom ($A_0$) electrode 44 adapted for emitting a current $I_0$ into the mud 18 and receiving the current $I_0$ from the mud 18, (3) an M1 measurement electrode 46 interposed between the $A_0$ electrode 44 and the A1 electrode 42, and (4) an M2 measurement electrode 48 interposed between the bottom $A_0$ electrode 44 and the A1 electrode 42.

The measurement electrodes 46 and 48 measure a voltage drop in a region of the conductive mud 18 which is located directly below the bottom electrode 44. This voltage drop is used to calculate the resistivity of the conductive mud 18 in the wellbore by using the following equation:

$$Rm = K(VM1-VM2)/I_0$$

In FIG. 8, a cross sectional side view of the novel measurement probe 26 of FIG. 7, taken along section lines 8—8 of FIG. 7, is illustrated.

In FIG. 8, the flat disk, on which the A1 electrode 42, the two measurement electrodes 48 and 46, and the bottom electrode 44 are located, is shown short circuited to the SP electrode 40. The bottom electrode 44 is disposed on the bottom of the measurement probe 26 of FIG. 8. When the probe 26 of FIG. 8 is energized, a current flows through the probe 26. When the current flows through the probe 26 of FIG. 8, the current $I_0$ is emitted from the bottom electrode 44 into the mud 18, and the current $I_0$ is received from the mud 18 into the bottom electrode 44.

When the current $I_0$ is initially emitted from the bottom electrode 44 of FIG. 8 and into the conductive mud 18, the current will initially flow through the mud in a direction which is approximately parallel to a longitudinal axis 24b of the novel measurement probe 26 of FIG. 8. The current will eventually be received in the A1 electrode 42.

On the other hand, when the current $I_0$ propagates from the A1 electrode 42 of FIG. 8 and into the mud 18, the current $I_0$ will eventually flow through the mud 18 in a direction which is approximately parallel to a longitudinal axis 24b of the novel measurement probe 26 of FIG. 8. The current will then be received in the bottom electrode 44.

For example, in FIG. 8, when the current $I_0$ is emitted from the bottom electrode 44 into the mud 18, the current $I_0$ is first emitted from the bottom electrode 44 in the downward direction into the conductive mud 18, in a direction which is approximately parallel to longitudinal axis 24b. As the current $I_0$ propagates In the mud 18, the current gradually wraps around in the manner shown in FIG. 8 until the current $I_0$ Is received by the A1 electrode 42. Since the initial direction of the current $I_0$ is in the downward direction, a direction which is approximately parallel to longitudinal axis 24b of the probe of FIG. 8, most of the current $I_0$ falls to function as a crossing current similar to the crossing current 22 of FIG. 1. That is, although only a very small amount of the current $I_0$ does cross the interface 16, almost all of the current $I_0$ fails to cross the interface 16 in FIG. 8 between the conductive mud 18 and a formation penetrated by wellbore 12.

Since the current $I_0$ flows in a direction which is approximately parallel to the longitudinal axis 24b of the probe of FIG. 8, at some point during the flow of the current, almost all of the current $I_0$ will be flowing in a region 45 of the mud 18 which is located directly below the bottom electrode 44. Since the measurement electrodes 46 and 48 are located directly adjacent that region 45, the measurement of the potential taken by the measurement electrodes 46 and 48 is controlled primarily by the potential drop which exists in the region 45 located in the mud directly below the bottom electrode 44, and not by the potential in the formation.

As a result, the novel measurement probe 26 of the present invention will measure only the resistivity of the mud 18. The resistivity of the formation penetrated by wellbore 12 will not adversely effect the accuracy of the mud resistivity measurement taken by the novel measurement probe 26 of the present invention shown in FIGS. 3 through 8.

Referring to FIG. 9, a functional description of the operation of the present invention will be set forth in the following paragraphs with reference to FIG. 9 of the drawings.

In FIG. 9, the novel measurement probe 26 is shown connected to a well logging apparatus 24 in the borehole 12. The well logging apparatus 24 energizes the probe 26 and, as a result, a current $I_0$ begins to flow in the conductive mud 18 between the bottom electrode 32 and the A1 electrode 34. The current $I_0$ is shown being emitted from and being received in the bottom electrode 32, the current $I_0$ flowing in a direction which is perpendicular to a plurality of equipotential lines 50. When the current $I_0$ is initially emitted from the bottom electrode 32 into the mud 18, it begins to flow in a direction 24c which approximately parallel to a longitudinal axis 24b of the logging apparatus 24. On the other hand, when the current $I_0$ is received from the mud 18 into the bottom electrode 32, it is flowing in the direction 24c which approximately parallel to a longitudinal axis 24b of the logging apparatus 24. When the current $I_0$ is being emitted from and is being received in the bottom electrode 32, almost all of the current flow is concentrated in a region 37 located directly below the bottom electrode 32 and disposed between a first equipotential line 50a and a second equipotential line 50b.

A plurality of voltage potentials, simulated by equipotential lines 50 in FIG. 9, are set up in the conductive mud 18 in the wellbore 12. Therefore, the voltage potential drop in region 37, between equipotential lines 50a and 50b, is the result solely of the current $I_0$ flowing in the mud 18. Stated differently, the voltage potential drop in region 37 is not the result of any current flowing in the formation penetrated by wellbore 12. The measurement electrodes 36 are located on equipotential lines 50a and 50b and enclose the region 37 in the mud. The measurement electrodes 36 are designed to measure the voltage potential in the mud 18, and the voltage potential of the mud 18 can be used to calculate the resistivity of the mud by using the following equation:

$$Rm = K(VM1 - VM2)/I_0$$

Since the measurement electrodes 36 are located on equipotential lines 50a and 50b and enclose the region 37 in the mud, the measurement of the voltage potential taken by measurement electrodes 36 is controlled solely by the voltage potential in region 37 of the mud located directly below the bottom electrode 32. The measurement taken by the measurement electrodes 36 is not controlled or influenced by the voltage potential in the formation penetrated by the borehole.

As a result, the accuracy of the mud resistivity measurement taken by the mud resistivity measurement probe 26 of the present invention is vastly improved over that of the AMS sub of FIG. 1.

Figure 10:
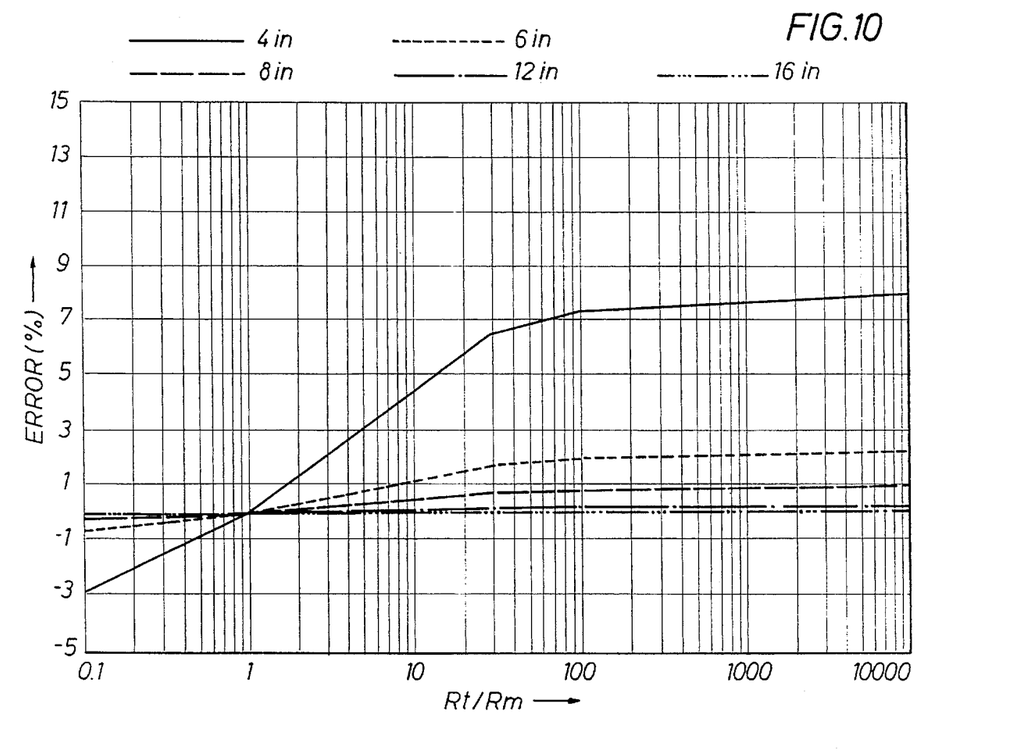
FIG. 10 illustrates the positive results obtained by using the novel measurement probe of the present invention, FIG. 10 illustrating the extremely small percent error which is obtained when the mud resistivity is measured by the novel measurement probe of the present invention, the percent error being represented by the following expression (Rm true–Rm)/(Rm_true), where such expression represents a difference between the true resistivity of mud (Rm_true) and the mud resistivity (Rm) measured by the novel measurement probe as a function of formation to mud resistivity contrast (Rt/Rm) and hole size.

Referring to FIG. 10, the results of a simulation using the novel measurement probe 26 of the present invention, shown in FIGS. 3 through 9, is illustrated.

FIG. 10 illustrates the positive results obtained by using the novel measurement probe of the present invention. More particularly, FIG. 10 illustrates the extremely small percent error (between the true resistivity of mud and the mud resistivity measured by the novel measurement probe as a function of Rt/Rm and wellbore size) which is obtained when the mud resistivity is measured by the novel measurement probe 26 of the present invention.

In FIG. 10, on the y-axis, a plot of the error in percent between the true mud resistivity value and the one measured by the probe 26 of the present invention is illustrated. On the x-axis, a plot of the formation to mud resistivity contrast in Rt/Rm is illustrated, ranging from unity to 10000 to 1. Five curves are shown for different wellbore diameters: 4, 6, 8, 12, and 16 in. These results were obtained when the probe 26 was centered inside the wellbore 12. In FIG. 10, the maximum error is about 8 percent for a 4 inch hole and less than 1 percent for a standard 8 inch hole over the entire Rt/Rm range on the x-axis. As the wellbore increases to 16 inches, the probe 26 is practically insensitive to the formation. Therefore, in large caves where correction is important, one should return a very accurate Rm measurement. The effect of tool eccentering was simulated for an 8 inch hole and a formation to mud resistivity contrast of 10000 to 1. No noticeable effect was found. This should not be a surprise if one considers the previous results in a 4 inch hole compared to an 8 inch hole. As expected, the Rm probe 26 is therefore sensitive primarily to the volume of mud located very close to the probe 26.

Experiments were made in a laboratory in a plastic container, simulating an infinite contrast Rt/Rm, and the probe 26 was configured like that shown in FIG. 3. An estimate of the mud resistivity to an accuracy better than 5 percent for any position of the probe inside the container was obtained including when the probe 26 was fully eccentered and in contact with the plastic container wall. An Rm log was also made in a test well which confirmed the quality and accuracy of the mud resistivity measurement. Excellent agreement was observed between the mud resistivity (Rm) value measured by the probe 26 of the present invention and the Rm value estimated by the wellbore correction algorithm disclosed in U.S. Pat. No. 5,041,975 to Minerbo et al.

In summary, the novel measurement probe 26 of the present invention measures mud resistivity inside the wellbore without being effected by the formation resistivity or the location of the tool string inside the wellbore. In addition, the probe 26 measures mud resistivity inside the wellbore at the end of a tool string. It measures mud resisitivity inside the wellbore and located on the bull nose 30 of FIG. 3. It measures the mud resistivity inside the wellbore looking down instead of sideways to minimize the influence of the formation resistivity on measurement accuracy. Finally, the probe 26 is a very low cost probe which does not require feedthrough capabilities and can be considered as a disposable item.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An apparatus adapted to be connected to a bottom of a tool string in a wellbore for measuring a resistivity of a mud in said wellbore, said apparatus having a bottom surface which includes a first plurality of surfaces occupied by electrodes and a second plurality of surfaces not occupied by electrodes, comprising:

a bottom electrode occupying one of said first plurality of surfaces having a bottom electrode surface and connected to a bottom of said apparatus when said apparatus is disposed in said wellbore, a region of said mud being disposed directly below said bottom electrode when said apparatus is disposed in said wellbore;

a second electrode occupying another of said first plurality of surfaces having a second electrode surface, said bottom electrode being adapted for emitting a first current into said region of said mud, said second electrode adapted for receiving said first current from said region of said mud, substantially all of said first current propagating in a direction which is approximately parallel to a longitudinal axis of said apparatus when said first current is initially emitted from said bottom electrode, said second electrode being adapted for emitting a second current into said region of said mud, said bottom electrode being adapted for receiving said second current from said region of said mud, substantially all of said second current propagating in a direction which is approximately parallel to the longitudinal axis of said apparatus when said second current is received in said bottom electrode; and at least one measurement electrode occupying still another of said first plurality of surfaces and having a measurement electrode surface and disposed adjacent said bottom electrode and said region of said mud adapted for measuring a voltage potential in said region, said voltage potential in said region being controlled by said current flowing in said region, said first plurality of surfaces including said bottom electrode surface and said second electrode surface and said measurement electrode surface, said first plurality of surfaces joining together with said second plurality of surfaces to form one substantially continuous bottom surface.

2. The apparatus of claim 1, further comprising:

a second measurement electrode occupying still another of said first plurality of surfaces and having a second measurement electrode surface and disposed adjacent said one measurement electrode adapted for measuring said voltage potential in said region, said first plurality of surfaces including said bottom electrode surface and said second electrode surface and said measurement electrode surface and said second measurement electrode surface, said first plurality of surfaces joining together with said second plurality of surfaces to form one substantially continuous bottom surface.

3. The apparatus of claim 1, further comprising:

a curved disk connected to said bottom of said tool string, said bottom electrode being mounted to an apex of said curved disk, said second electrode and said one measurement electrode being mounted on a remaining portion of said curved disk.

4. The apparatus of claim 3, further comprising:

a second measurement electrode occupying still another of said first plurality of surfaces and having a second measurement electrode surface, mounted on said remaining portion of said curved disk and disposed adjacent said one measurement electrode on said curved disk adapted for measuring said voltage potential in said region of said mud, said first plurality of surfaces including said bottom electrode surface and said second electrode surface and said measurement electrode surface and said second measurement electrode surface, said first plurality of surfaces joining together with said second plurality of surfaces to form one substantially continuous bottom surface.

5. The apparatus of claim 1, further comprising:

a flat disk connected to said bottom of said tool string, said bottom electrode being mounted to a center of said flat disk, said second electrode and said one measurement electrode being mounted on a remaining portion of said flat disk.

6. The apparatus of claim 5, further comprising:

a second measurement electrode electrode occupying still another of said first plurality of surfaces and having a second measurement electrode surface, mounted on said remaining portion of said flat disk and disposed adjacent said one measurement electrode on said flat disk adapted for measuring said voltage potential in said region of said mud, said first plurality of surfaces including said bottom electrode surface and said second electrode surface and said measurement electrode surface and said second measurement electrode surface, said first plurality of surfaces joining together with said second plurality of surfaces to form one substantially continuous bottom surface.

7. A method of measuring a resistivity of mud in a wellbore, comprising the steps of:

lowering a measurement probe into said wellbore, said probe having a bottom surface which includes a first plurality of surfaces occupied by electrodes and a second plurality of surfaces not occupied by electrodes and including a second electrode occupying one of said first plurality of surfaces and having a second electrode surface and a bottom electrode occupying another of said first plurality of surfaces and having a bottom electrode surface located at a bottom of the probe when said probe is disposed in said wellbore, said first plurality of surfaces including said second electrode surface and said bottom electrode surface, said first plurality of surfaces joining together with said second plurality of surfaces to form one substantially continuous bottom surface;

emitting a current from said bottom electrode into said mud;

receiving said current from said mud into said second electrode;

emitting said current from said second electrode into said mud; and receiving said current from said mud into said bottom electrode, substantially all of said current flowing in said mud in a direction which is approximately parallel to a longitudinal axis of said probe when said current is initially emitted from said bottom electrode into said mud and said current is received from said mud into said bottom electrode.

8. The method of claim 7, wherein a region of said mud is located directly below said bottom electrode, said probe including at least one measurement electrode occupying still another of said first plurality of surfaces and having a measurement electrode surface disposed adjacent said region, said first plurality of surfaces including said second electrode surface and said bottom electrode surface and said measurement electrode surface, said first plurality of surfaces joining together with said second plurality of surfaces to form one substantially continuous bottom surface, comprising the steps of:

using said measurement electrode, measuring a voltage potential which exists in said region of said mud, said resistivity of said mud being measured in response to the measurement of said voltage potential by said measurement electrode.

9. A measurement probe adapted to be connected to a bottom of a tool string in a wellbore for measuring a resistivity of a conductive mud in said wellbore, comprising:

a current emitting electrode connected to a bottom of said probe when said probe is connected to said bottom of said tool string in said wellbore and adapted for emitting a current into said mud, substantially all of said current being initially emitted from said current emitting electrode propagating in a downward direction into said conductive mud in said wellbore, said downward direction of the initially emitted current propagating from said current emitting electrode being approximately parallel to a longitudinal axis of said measurement probe, said probe having a bottom surface which includes a first surface occupied by said current emitting electrode and a second surface not occupied by said current emitting electrode, said first surface joining together with said second surface to form one substantially continuous bottom surface.

10. The probe of claim 9, wherein said first surface includes a first plurality of surfaces and said second surface includes a second plurality of surfaces and wherein said probe further comprises a current receiving electrode for receiving said current from said conductive mud, one of said first plurality of surfaces being occupied by said current emitting electrode and another of said first plurality of surfaces being occupied by said current receiving electrode, said second plurality of surfaces not being occupied by said current emitting electrode and said current receiving electrode, said first plurality of surfaces joining together with said second plurality of surfaces to form one substantially continuous bottom surface.

11. The probe of claim 10, further comprising a pair of measurement electrodes disposed between said current emitting electrode and said current receiving electrode and adapted for measuring a drop of potential between said pair of measurement electrodes, still another of said first plurality of surfaces being occupied by one of said pair of measurement electrodes and still another of said first plurality of surfaces being occupied by the other of said pair of measurement electrodes, said first plurality of surfaces being occupied by said current emitting electrode and said current receiving electrode and said pair of measurement electrodes, said second plurality of surfaces not being occupied by said current emitting electrode, said current receiving electrode, and said pair of measurement electrodes, said first plurality of surfaces joining together with said second plurality of surfaces to form one substantially continuous bottom surface.

12. A method of measuring a resistivity of a conductive mud in a wellbore, comprising the steps of:

placing a measurement probe in said wellbore which contains said conductive mud, said probe including a current emitting electrode connected to a bottom of said probe, a current receiving electrode, and a pair of measurement electrodes, said probe having a bottom surface including a first plurality of surfaces occupied by said current emitting electrode, said current receiving electrode, and said pair of measurement electrodes, respectively, and a second plurality of surfaces not occupied by an electrode, said first plurality of surfaces joining together with said second plurality of surfaces to form one substantially continuous bottom surface;

emitting a current from said current emitting electrode into said mud in said wellbore, substantially all of said current being initially emitted from said current emitting electrode propagating in a downward direction into said mud in said wellbore, said downward direction of the initially emitted current from said current emitting electrode being approximately parallel to a longitudinal axis of said probe;

receiving said current in said current receiving electrode; and measuring a drop of potential across said measurement electrodes, said drop of potential representing said resistivity of said conductive mud in said wellbore.

13. In a logging apparatus adapted to be disposed in a mud filled wellbore including a tool string and a measurement apparatus having a bottom surface connected to an end of said tool string and adapted for measuring a resistivity of the mud in said wellbore, said measurement apparatus comprising:

a current emitting electrode connected to an end of said measurement apparatus and located at a bottom of said logging apparatus when said logging apparatus is disposed in the wellbore, said current emitting electrode adapted to initially emit a current, substantially all of said current being initially emitted from said current emitting electrode propagating in a downward direction into the mud in said wellbore when said logging apparatus is disposed in said wellbore, said downward direction of the initially emitted current from said current emitting electrode being approximately parallel to a longitudinal axis of said logging apparatus when said logging apparatus is disposed in said wellbore; and a current receiving electrode adapted to receive said current propagating in said mud, said bottom surface of said measurement apparatus including a first plurality of surfaces and a second plurality of surfaces, one of said first plurality of surfaces being occupied by said current emitting electrode, another of said first plurality of surfaces being occupied by said current receiving electrode, said second plurality of surfaces not being occupied by an electrode, said first plurality of surfaces of said bottom surface of said measurement apparatus joining together with said second plurality of surfaces of said bottom surface of said measurement apparatus to form one substantially continuous bottom surface.

14. In the logging apparatus of claim 13, wherein said measurement apparatus further comprises:

a pair of measurement electrodes disposed between said current emitting electrode and said current receiving electrode, still another of said first plurality of surfaces being occupied by one of said pair of measurement electrodes, still another of said first plurality of surfaces being occupied by the other of said pair of measurement electrodes, said first plurality of surfaces being occupied by said current emitting electrode and said current receiving electrode and said pair of measurement electrodes, respectively, said first plurality of surfaces joining together with said second plurality of surfaces to form one substantially continuous bottom surface.

15. A measurement apparatus having a surface adapted to be connected to an end of a tool string in a mud filled wellbore for measuring a resistivity of the mud in the mud filled wellbore, comprising:

a return electrode on said surface; and electrode means on said surface for emitting a current into the mud and measuring a potential drop in said mud, said electrode means including, a current emitting electrode located on said surface at a center of said electrode means and disposed at a bottom of said measurement apparatus when said measurement apparatus is disposed in said wellbore for initially emitting said current, substantially all of said current being initially emitted from said current emitting electrode propagating in a downward direction into said mud in said wellbore when said measurement apparatus is disposed in said wellbore, said downward direction of the initially emitted current from said current emitting electrode being approximately parallel to a longitudinal axis of said measurement apparatus, said current from said current emitting electrode propagating in said mud, said current being received from said mud in said return electrode, said electrode means measuring said potential drop in said mud, said potential drop being representative of said resistivity of said mud in said wellbore, said surface of said measurement apparatus including a first plurality of surfaces occupied by said return electrode and said current emitting electrode, respectively, and a second plurality of surfaces not occupied by said return electrode and said current emitting electrode, said first plurality of surfaces joining together with said second plurality of surfaces to form one substantially continuous bottom surface.

16. The measurement apparatus of claim 15, wherein said electrode means further comprises:

a pair of measurement electrodes on said surface adapted for measuring said potential drop in said mud, said first plurality of surfaces being occupied by said return electrode and said current emitting electrode and said pair of measurement electrodes, respectively, said second surface not being occupied by said return electrode and said current emitting electrode and said pair of measurement electrodes, said first plurality of surfaces joining together with said second plurality of surfaces to form one substantially continuous bottom surface.

17. The measurement apparatus of claim 16, wherein said electrode means further comprises:

a curved disk connected to said end of said tool string including said current emitting electrode located at a center of said curved disk and said pair of measurement electrodes disposed on said curved disk adjacent said current emitting electrode.

18. The measurement apparatus of claim 16, wherein said electrode means further comprises:

a flat disk connected to said end of said tool string including said current emitting electrode located at a center of said flat disk and said pair of measurement electrodes disposed on said flat disk adjacent said current emitting electrode.

19. A method of measuring a resistivity of a mud in a mud filled wellbore, comprising the steps of:

lowering a measurement apparatus into said mud filled wellbore, said measurement apparatus including a surface;

emitting a current from a bottom part of said measurement apparatus, substantially all of said current being initially emitted from said bottom part of said measurement apparatus propagating in a downward direction into said mud in said wellbore, said downward direction of the initially emitted current being approximately parallel to a longitudinal axis of said measurement apparatus;

receiving said current into a receiving part of said measurement apparatus, said surface of said measurement apparatus including a first plurality of surfaces occupied by said bottom part and said receiving part, respectively, of said measurement apparatus and a second plurality of surfaces not occupied by said bottom part and said receiving part, said first plurality of surfaces joining together with said second plurality of surfaces to form one substantially continuous bottom surface; and measuring a drop of potential in said mud when said current is emitted from said bottom part into said mud, said drop of potential being representative of said resistivity of said mud in said mud filled wellbore.

20. The method of claim 19, wherein said measurement apparatus includes a well logging apparatus tool string and a measurement probe connected to an end of said tool string, said probe having said surface and including said bottom part and said receiving part disposed on said surface, said probe being connected to a bottom of said tool string when said measurement apparatus is disposed in said wellbore, said surface of said probe including said first plurality of surfaces occupied by said bottom part and said receiving part, respectively, of said probe and said second plurality of surfaces not occupied by said bottom part and said receiving part, said first plurality of surfaces joining together with said second plurality of surfaces, to form one substantially continuous bottom surface the lowering step including the step of:

initially lowering said probe into said wellbore; and subsequently lowering said tool string into said wellbore during the lowering of said probe into said wellbore, said probe being located at a bottom of said measurement apparatus when said probe and said tool string is disposed in said wellbore.

21. The method of claim 20, wherein said measurement probe includes a current emitting electrode located at said bottom part of said probe when said measurement apparatus including said probe is disposed in said wellbore, a current receiving electrode located at said receiving part of said probe, and a pair of measurement electrodes disposed between said current emitting electrode and said current receiving electrode, said first plurality of surfaces being occupied by said current emitting electrode and said current receiving electrode and said pair of measurement electrodes, respectively, said second plurality of surfaces not being occupied by the electrodes, said first plurality of surfaces joining together with said second plurality of surfaces, to form one substantially continuous bottom surface and wherein said emitting step comprises the step of:

emitting said current from said current emitting electrode, substantially all of said current being emitted from said current emitting electrode propagating initially in a downward direction into said mud in said wellbore, said downward direction of the initially emitted current being approximately parallel to a longitudinal axis of said measurement probe.

22. The method of claim 21, wherein the receiving step comprises the step of:

receiving said current into said current receiving electrode.

23. The method of claim 22, wherein the measuring step comprises the step of:

measuring said drop of potential across said measurement electrodes, said drop of potential across said measurement electrodes representing the potential drop in said mud when said current is emitted into said mud, said drop of potential across said measurement electrodes being representative of said resistivity of said mud in said mud filled wellbore.

* * * * *